United States Patent
Klehn et al.

(10) Patent No.: US 6,850,099 B2
(45) Date of Patent: Feb. 1, 2005

(54) SCALABLE DRIVER DEVICE AND RELATED INTEGRATED CIRCUIT

(75) Inventors: Bernd Klehn, Unterhaching (DE); Ralf Klein, München (DE); Joachim Schnabel, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/261,200

(22) Filed: Sep. 30, 2002

(65) Prior Publication Data

US 2003/0062932 A1 Apr. 3, 2003

(30) Foreign Application Priority Data

Sep. 29, 2001 (DE) .......................... 101 48 338

(51) Int. Cl.[7] .............................. H03B 1/00
(52) U.S. Cl. ........................................ 327/108
(58) Field of Search ............................. 327/108, 109, 327/112, 170, 175–176, 403; 326/82–87

(56) References Cited

U.S. PATENT DOCUMENTS

| | | | |
|---|---|---|---|
| 5,834,955 A | 11/1998 | Eichfeld et al. | 327/108 |
| 5,949,254 A | 9/1999 | Keeth | 326/87 |
| 6,040,724 A | 3/2000 | Kamiya | 327/170 |
| 6,081,915 A * | 6/2000 | Kalluri et al. | 714/724 |

FOREIGN PATENT DOCUMENTS

| | | |
|---|---|---|
| DE | 195 45 904 A1 | 6/1997 |
| DE | 697 03 808 T2 | 9/1997 |
| DE | 100 34 713 A1 | 2/2002 |
| EP | 0 793 347 B1 | 9/1997 |

OTHER PUBLICATIONS

Mattes, H. et al.: "Propagation Delay Calculation for Interconnection Nets on Printed Circuit Boards by Reflected Waves", ACM, 1991, pp. 567–572.

* cited by examiner

Primary Examiner—My-Trang Nuton
(74) Attorney, Agent, or Firm—Laurence A. Greenberg; Werner H. Stemer; Gregory L. Mayback

(57) ABSTRACT

In a scalable driver device having a plurality of driver stages whose outputs are connected to a common terminal contact for providing a common output signal, drive parameters of the driver stages, individually or in groups, are so dimensioned that the difference of the edge rise times and/or fall times of the output signal from one active driver stage to the next driver stage to be activated is substantially equal to the difference of the edge rise times and/or fall times from a next activated driver stage to the one activated after that.

10 Claims, 3 Drawing Sheets

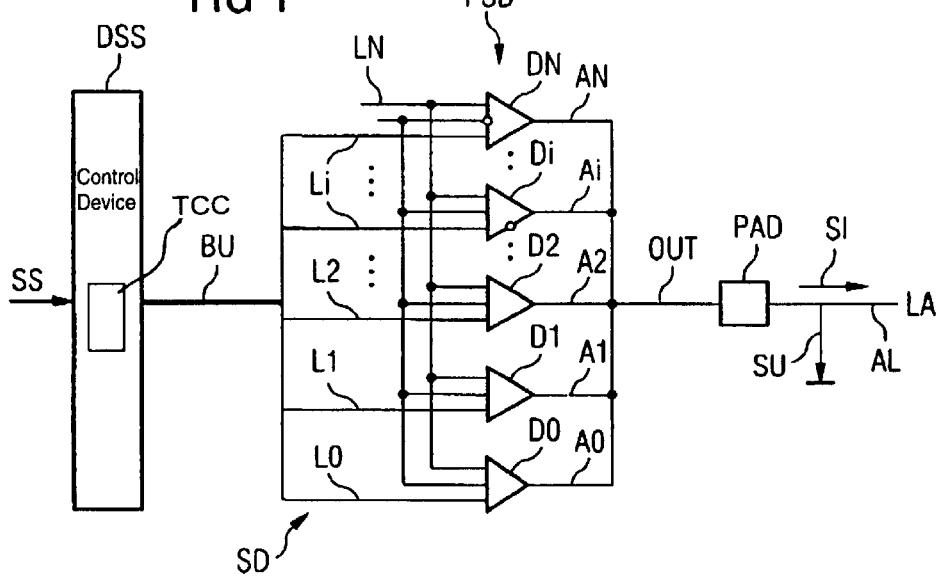
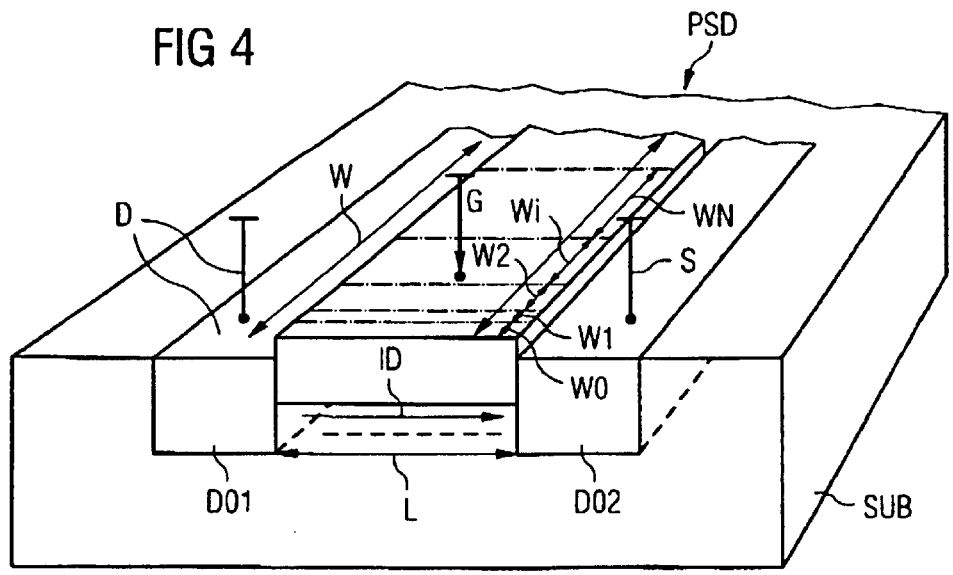

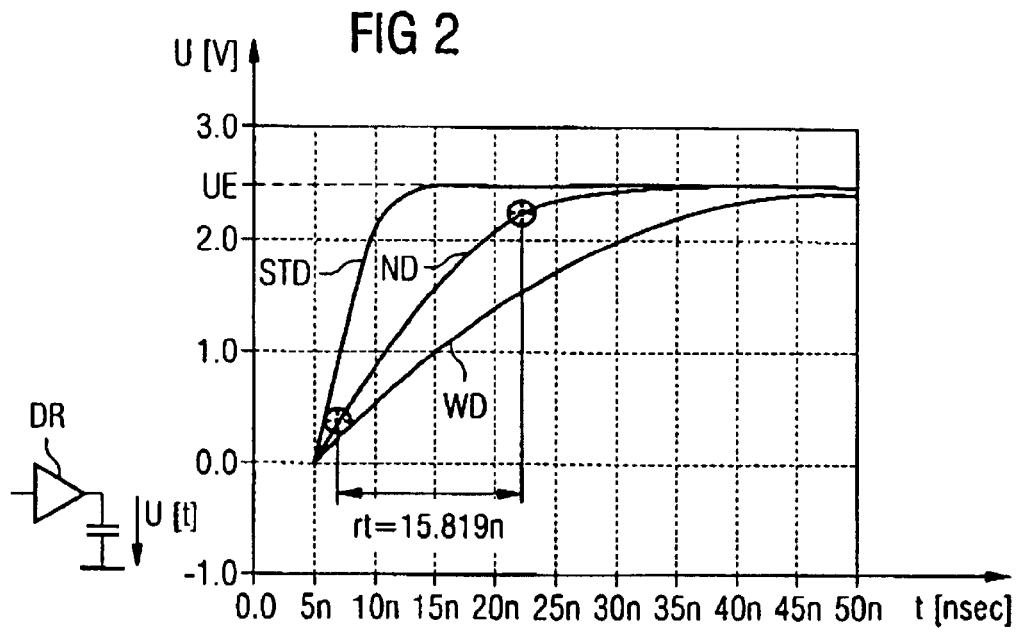
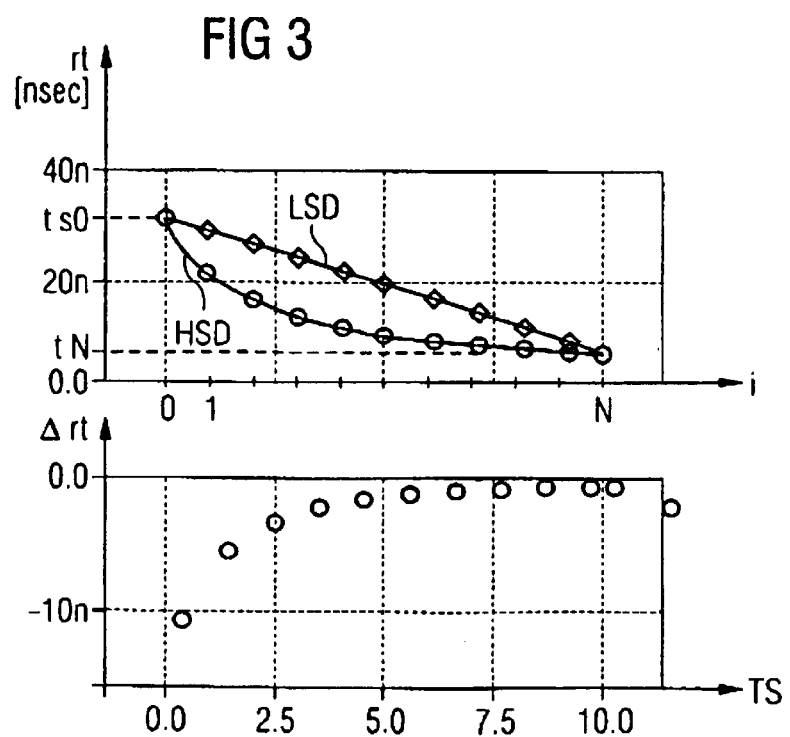

SCALABLE DRIVER DEVICE AND RELATED INTEGRATED CIRCUIT

BACKGROUND OF THE INVENTION

Field of the Invention

The invention relates to a scalable driver device with a plurality of drive stages, whose outputs are connected to a common terminal contact for providing a common output signal, and with at least one control unit with which the drive stages can be activated and/or deactivated individually or in groups.

Voltage rise times and fall times are significant practical parameters of drivers in microelectronics, particularly of what are known as pad drivers (terminal contact drivers) or off chip drivers (OCD). The reason is that it is desirable to specifically adapt the voltage and/or current curve at the output of this type of driver to the respectively prescribed external load wiring for purposes of improving the electromagnetic compatibility (EMC) of integrated circuits. "Soft" voltage and/or current curves on signal lines which are connected to the respective driver output are particularly advantageous, because they substantially prevent abrupt low/high and/or high/low alternation which could lead to inductive and/or capacitive overcoupling of electromagnetic interference fields. However, as Paper 33.3 of the 28$^{th}$ ACM/IEEE Design Automation Conference (pp. 567–72) explains, there is no EMV-optimal driver for all load instances that are possible in practice. Rather, current rise time and fall times, in particular, as well as other parameters of the respective driver, are dependent on interference factors such as the instantaneous operating temperature, the applied supply voltage, the driver circuit fabrication technique, influences of an output-side load, and so on. It is therefore desirable in practice to provide driver circuits with flexible driver powers; i.e. not just a single driver power but rather several should be available. Besides drivers with an analog adjustment mechanism, digitally scalable drivers exist, such as those described in Published, Non-Prosecuted German Patent Application No. DE 195 45 904 A1, corresponding to U.S. Pat. No. 5,834,955. These have a number of control lines with which a defined number of subdrivers can be switched in, with a defined desired effective driver power deriving from the sum of the driver powers of the individual subdrivers.

SUMMARY OF THE INVENTION

It is accordingly an object of the invention to provide a scalable driver device and a related integrated circuit which overcomes the above-mentioned disadvantages of the prior art methods of this general type, in which edge rise times and/or edge fall times, in particular, of the output signal of a driver device can be adjusted with improved flexibility.

With the foregoing and other objects in view there is provided, in accordance with the invention, a scalable driver device. The scalable driver device has a common terminal contact providing a common output signal, and a plurality of driver stages having outputs connected to the common terminal contact for generating the common output signal. The driver stages have drive parameters dimensioned individually or in groups such that a difference of edge rise times and/or fall times of the common output signal from one of the driver stages being an active driver stage to a next one of the driver stages to be activated being substantially equal to a difference of the edge rise times and/or fall times of the common output signal from the next one of the driver stages activated to a further next one of the driver stages to be activated. At least one control unit is connected to the driver stages for activating and deactivating the driver stages individually or in groups.

The object is achieved in a driver device of the above type by dimensioning driver parameters of the driver stages individually or in groups such that the difference of the edge rise times and/or edge fall times of the output signal from one active driver stage to the next stage to be activated is substantially equal to the difference of the edge rise times and/or fall times from the next activated driver stage to the stage activated after that.

This effectuates a substantial linearization of the curve of the edge rise times and/or fall times of the output signal of the driver device, on the basis of which it is possible to specifically adapt a particular desired edge rise time and/or fall time for the output signal to the respective relations easily and reliably. In particular, it is easier to control the edge rise time and/or fall time of the output signal to a particular prescribable desired value or target value, because there is a substantially directly proportional relation between the number of activated driver stages and the edge rise time and/or fall time of the output signal.

The invention also relates to an integrated circuit with at least one inventive driver device.

In accordance with an added feature of the invention, each of the driver stages is a single driver. A respective driver stage is formed by a sum of individual ones of the driver stages that have already been activated.

In accordance with an additional feature of the invention, each of the driver stages has at least one transistor with a gate width that is adjustable. The gate widths are the drive parameters. The gate width is dimensioned according to:

$$wi = 1 \bigg/ \left( \frac{1}{w0} - C \cdot i \right), \text{ with}$$

$$C = \left( \frac{1}{w0} - \frac{1}{wN} \right) \bigg/ N.$$

whereby wi references the gate width of the at least one transistor of a respective one of the driver stages; w0 is the gate width of a driver stage of the plurality of driver stages having a longest edge rise time and/or fall time; wN is the gate width of a driver stage of the plurality of driver stages having a shortest edge rise time and/or fall time; and N is an index of a last driver stage of the plurality of driver stages.

In accordance with another feature of the invention, the gate width of each of the driver stages is dimensioned according to:

$$wi^* = wi - \sum_{j=0}^{i-1} w * j, i = 1, \ldots, N$$
$$= wi - w(i-1)$$

where w(i−1) is an effective overall gate width of a group of the driver stages that have already been activated as a group.

In accordance with a further feature of the invention, a thermometer code counter for actuating the driver stages is provided. The thermometer code counter is coupled to or integrated in the control unit.

In accordance with a concomitant feature of the invention, the driver stages are dimensioned with respect to at least one of the drive parameters such that the edge rise time and/or fall time of the common output signal varies by approximately a same amount from one driver stage to a next driver stager given successive activation.

Other features which are considered as characteristic for the invention are set forth in the appended claims.

Although the invention is illustrated and described herein as embodied in a scalable driver device and a related integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a first exemplifying embodiment of a driver device according to the invention;

FIG. 2 is a graph showing output signals of three different conventional single-driver stages with different edge rise times—i.e. a response behavior of the output signal at the respective single-driver stage during a low/high level shift as a function of time;

FIG. 3 is a graph showing the edge rise times and the related first derivative of the edge rise time curve in the driver device according to FIG. 1, compared to the edge rise time curve of a conventional driver device with driver stages with equidistant gate widths;

FIG. 4 is a partial, perspective view of a physical equivalent circuit diagram for the plurality of driver stages of the driver device shown in FIG. 1;

DESCRIPTION OF THE PREFERRED EMBODIMENTS

Figure 5:
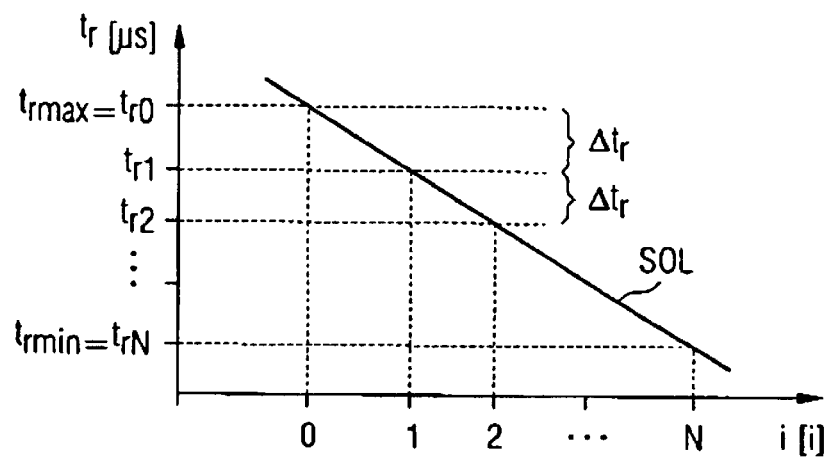
FIG. 5 is a graph showing a desired linear curve of the edge rise time and/or fall time of the output signal of the driver device according to FIG. 1 as a function of the index of the respective activated driver stage of the plurality of driver stages.

In all the figures of the drawing, sub-features and integral parts that correspond to one another bear the same reference symbol in each case unless expressly stated otherwise. Referring now to the figures of the drawing in detail and first, particularly, to FIG. 1 thereof, there is shown an exemplifying schematic representation of a first scalable driver device SD. At least one such driver device is advantageously a component of an integrated circuit, a microchip, an SDRAM module, or some other microelectronic storage element. The driver device SD contains a plurality of driver stages D0–DN which are connected parallel to one another; i.e., they contain separate input control lines L0–LN and output lines A0–AN, respectively, which are connected to a common output line OUT. The common output line OUT is connected to a common terminal contact PAD. Of course, the individual output lines Ai (i=0 to N) of the driver stages Di (i=0 to N) can also be connected directly to the common terminal contact PAD. In the exemplifying embodiment, the individual driver stages D0 with DN are expediently disposed over one another in one row or column in parallel fashion. The indices of the driver stages Di rise from i=0 to i=N. Bonded (i.e. connected) to the common terminal contact PAD is an output line AL, which is charged by an external load on the output side, usually a downstream switching network, a capacitor, resistances, or other electrical components. A voltage SU is thus present at the terminal contact PAD, and a driver current SI flows to a load LA. The effective driver power at the common output OUT of the driver device SD is thus the sum of the subdriver powers of the individual driver stages that are simultaneously active, or switched in. The effective driver power is proportional to what is known as the current driver capability. Specifically, the output current SI is a measure of the overall driver power of the driver device SD, which derives from the sum of the driver powers of all active driver stages D0 to DN. Another measure of the driver power is the edge rise time and/or fall time of the respective overall output signal, particularly of the output voltage SU at the common terminal contact PAD.

FIG. 2 is a voltage/time diagram representing time curves of the output signal of three different conventional single-driver stages DR (added on the left half of the drawing) for three different constellations. A time t is plotted along the abscissa. The time data t are given in ns. As an output signal of the driver stage DR, an output voltage U in volts is plotted along the ordinate. A curve STD of the output signal U(t) represents a "strong" single driver whose output signal U(t) rises more rapidly compared to the other two curves from an output value of 0 volts to a desired final value UE; i.e., it exhibits the greatest edge steepness dU/dt. The bottom output signal curve WD in the diagram of FIG. 2 represents a single driver with "weak" power, whereby the output signal U(t) takes longer to rise to the desired final value UE than in the curve STD of the strong driver. The edge rise time of the curve WD of the weaker driver is thus greater than the edge rise time of the curve SD of the stronger driver. Between these two curves STD and WD is the time curve of the output signal U(t) of a driver with "intermediate" power, for comparison purposes. In the context of the invention, edge rise time refers to the time span required by the output signal of the respective driver in order to rise from approximately 10% of its operating voltage to approximately 90% of its operating voltage. The reverse applies to the edge fall time, accordingly.

The individual driver stages D0–DN of the driver device SD of FIG. 1 can be activated and/or deactivated individually by way of the control lines L0 to LN on the input side—i.e., selectively activated and/or deactivated with the aid of a control unit DSS, particularly a driver power adjusting device.

The driver stages D0 to DN of FIG. 1 are expediently formed by a single driver, respectively. Each driver contains at least one CMOS inverter. In practice the edge rise time and fall time of such a CMOS inverter is approximately inversely proportional to the amplification factor $\beta P$ of the p-channel transistor or $\beta N$ of the n-channel transistor. If the respective transistor length between the p-channel transistor and the n-channel transistor of the respective CMOS inverter is held substantially constant, then the now described relation applies.

The edge rise time tr of the output signal of the respective driver is inversely proportional to the transistor width wp of the p-channel transistor; the edge fall time of the output signal of such a driver is inversely proportional to the driver width wn of the n-channel transistor. The behavior of a scalable PAD driver can be described in close approximation by a CMOS inverter, whereby active parallel driver output stages are integrated. This is schematically represented in FIG. 4. That is a spatial representation of an equivalent circuit diagram of the series of integrated parallel driver stages D0–DN of the driver device SD of FIG. 1 in CMOS technology. The description will relate to its p-channel transistor for exemplification purposes. This contains a first p-doped zone DO1 that is disposed at a cross-axial distance L from the second p-doped zone DO2. L references what is known as a gate length of the doped substrate zones DO1, DO2 in CMOS technology. What is known as the drain voltage D is connected at the first doped zone DO1. To that end, the second doped zone DO2 forms what is known as the source for the current flow ID between the two-doped zones by applying a source voltage S. With the aid of a control voltage G, the electrical field in the n-doped substrate SUB is applied between the two parallel transistor channels, which are disposed at a cross-axial distance L from one another. The longer the axial extent of the doped zones DO1, DO2 is, the greater the current flow between the two zones is. In CMOS technology, the axial extent is identified as gate width W. The interconnecting of the individual driver stages D0–DN of the driver device SD according to FIG. 1 is illustrated in the equivalent circuit diagram of FIG. 4 by the parallel connection of a plurality of gate widths w1–wN, the sum of which is the overall gate width W.

Assuming that each individual driver stage D0–DN had simply the same gate width wi=constant, an output signal such as SU(t) would result, whose edge rise times from one driver stage to the next given additional switching-in or additional activating—i.e. given incremental switching-in of the individual driver stages Di, with i=0 to N—would have a non-linear curve. This is represented schematically in FIG. 3. The index i of the respective driver stage Di (i=0t to N) is plotted along the abscissa. The associated edge rise times rt in nsec are plotted along the ordinate. The curve contour for the driver stages with a constant gate width wi is represented as HSD in FIG. 3. The individual edge rise time values for each driver stage with the index i are indicated by circles, respectively. The curve HSD, represents the simulation of the rise times rt of a PAD driver (represented by circles), in which the effective, i.e. totaled, transistor width of the p-channel transistor has been modified in equal increments. This results in a hyperbolic behavior; i.e., the change in the edge rise time rt from one driver stage Di to the next largest driver stage Di+1 is large for small driver stages and vice versa. The change in the rise time is represented in the bottom half of FIG. 3. The driver power TS is plotted along the abscissa, while the rise time variation Δrt is plotted along the ordinate. The hyperbolic behavior would be problematic with respect to the controlling of the rise time, given that in practice control processes favor linear controlled variables which cross the region between the smallest and largest rise time at equal distances therefrom.

In order to achieve such desired linear scaling of the edge rise time and/or fall time curves as a function of the index i of the respectively active driver stage, the gate width or transistor width of each driver stage D0 to DN is dimensioned such that driver parameters wi of the driver stages D0 to DN are dimensioned individually or in groups such that the difference (e.g. Δtr0=tr0−tr1) of the edge rise times and/or fall times (tr0, tr1) of the output signal (SU) from one active driver stage to the next stage to be activated (D0,D1) is substantially equal to the difference (Δtr1=tr1−tr2) of the edge rise times and/or fall times from said next activated driver stage to the one activated after that (D1,D2). In general terms, at least one parameter of each driver stage is configured to produce a linear relation between the index of the respectively activated driver stage and the rise time and/or fall time of the overall output signal.

The driver device SD of FIG. 1 is advantageously driven such that only a single driver stage is active while all others are switched out, i.e. inactive. The driver stage D0 is assigned the lowest power, i.e. the greatest edge rise time and/or fall time, in the chain of driver stages Di (i=0 to N). The subsequent driver stages D1 to DN then have successive, incrementally increasing drive powers. This corresponds to incrementally shorter edge rise times and/or fall times of the overall output signal (SU). The gate widths or transistor widths of each driver stage D0–DN, which determine its power, specifically its edge rise times and/or fall times, are expediently configured such that the rise time and fall time varies by approximately the same amount from one driver stage to the next. The transistor width which leads to the longest rise time tr0 is referenced w0; the one with the fastest edge trN is referenced wN. In order to dimension the gate width of each driver stage D0 to DN such that the difference of the edge rise times and/or fall times of the sum output signal of the driver device SD from one driver stage to the next is approximately equal to the difference of the edge rise times and/or fall times from the next driver stage to the one activated after that, the following conditions are presumed. A scalable driver device with N+1 subdrivers D0–DN is provided. The width of the smallest subdriver, that is to say, the smallest driver stage D0, is w0; the resulting edge rise time is tr0=trmax. The width of the largest subdriver, the largest driver stage DN, is wN; the resulting edge rise time is trN=trmin.

What must now be found are the gate widths w1, w2, wN−1 of the subdrivers—the driver stages D1, D2, . . . , DN−1—given which the following condition is satisfied: tri−tri+1=constant=Δtr, whereby i=0,1,2, . . . , N−1. This desired curve of the edge rise times tr of the output signal of the driver device SD of FIG. 1 as a function of the driver stage index i is represented in FIG. 5 and referenced SOL. The curve is defined as a falling line; that is, the same difference value Δtr is given for the edge rise time from an index value i to the next index value i+1. This results in the following intermediate computation:

$$tr\text{max} = tr0 = \frac{\tilde{K}}{w0}; \tilde{K} = \text{constant}$$

$$tr\text{min} = trN = \tilde{K}/wN$$

$$tri = \frac{\tilde{K}}{wi}; i = 0, 1, \ldots, N$$

$$\Delta tr = tri - tr(i+1) = (tr\text{max} - tr\text{min})/N$$

$$tri = \frac{\tilde{K}}{wi} = (N-i)\Delta tr + tr\min$$

$$= \frac{N-i}{N}(tr\max - tr\min) + tr\min$$

$$= tr\max - tr\min - \frac{i}{N} \cdot tr\max + \frac{i}{N} tr\min + tr\min$$

$$= \left(1 - \frac{i}{N}\right)tr\max + \frac{i}{N} tr\min$$

$$= \left(1 - \frac{i}{N}\right)\frac{\tilde{K}}{w0} + \frac{i}{N}\frac{\tilde{K}}{wN}$$

$$\frac{1}{wi} = \left(1 - \frac{i}{N}\right)\frac{1}{w0} + \frac{i}{N}\frac{1}{wN}$$

$$wi = \frac{1}{\left(1 - \frac{i}{N}\right)\frac{1}{w0} + \frac{i}{N}\frac{1}{wN}}$$

$$= \frac{1}{\frac{1}{w0} - \frac{i}{N}\left(\frac{1}{w0} - \frac{1}{wN}\right)}$$

In general, the following equation then applies for the width wi of the $i^{th}$ driver stage Di:

$$E1: wi = \frac{1}{\frac{1}{w0} - C \cdot i}; \text{ with } C = \frac{1}{N}\left(\frac{1}{w0} - \frac{1}{wN}\right)$$

Instead of the selective individual activating of the driver stages D0–DN in the form of a "continuous activation chain", it may also be expedient to actuate the chain of driver stages in the manner by what is known as a thermometer code counter TCC. In other words, starting with the driver stage D0 with the weakest current driver capability, the next strongest driver stage is incrementally activated (that is, D1*, D2*, and so on until DN*), but in contrast to the first exemplifying embodiment, previously activated driver stages with the lower index i are not deactivated and remain active. The sequence of activation (i.e. through-switching) of the driver stages D0–DN* then occurs as now described. The thermometer code counter TCC is integrated in the control device DSS or is coupled to it.

The first driver stage D0 with a defined edge rise time tr1 is activated first. Next, the second driver stage D1 is switched in, the effect of which is a decreasing of the edge rise time of the output signal by Δtr. If still greater driver power of the driver device SD is desired, then the third driver stage D2* is added to the already active two driver stages D0, D1*, the result of which is that the edge rise time for the output signal is reduced by 2Δtr relative to the edge rise time of the output signal when only the first driver stage D0 was switched in. The decreasing of the edge rise time tr by Δtr=constant (i.e. by the same constant amount) then ensues with the incremental switching-in of additional driver stages with higher indices.

In this instance whereby the driver stages D0–DN* are activated according to the principle of a thermometer code counter, the gate width of each driver stage Di* is governed by the following relation:

$$E2: wi^* = wi - \sum_{j=0}^{i-1} w*j, \; i = 1, \ldots, N$$

$$= wi - w(i-1)$$

Wi is computed from E1 and describes the width of the driver stage Di given individual actuation. Wi is computed from E2 and describes the width of the driver stage D*i which must be activated in addition to the driver stages D0 to D*(i−1) which are already active in order to achieve the width wi. The equation wo*=wo applies.

The driver stages D0–DN can be activated or deactivated by way of the signal lines L0–LN of the driver device SD of FIG. 1. The weakest driver stage D0 is preferably always active. The function block DSS advantageously contains an evaluation circuit for activating the remaining subdrivers (i.e. driver stages). Assuming that the driver power is to be incrementally increased or decreased, known circuits for a synchronous thermometer code counter can be utilized. The function thereof is to set the lowest-value bit (low) to high with the incrementing operation. In the decrementing operation, the highest-value bit (high) is set to low. Thus, the next largest driver setting is activated, or the next smallest driver power is selected, depending on the direction of counting.

Figure 6:
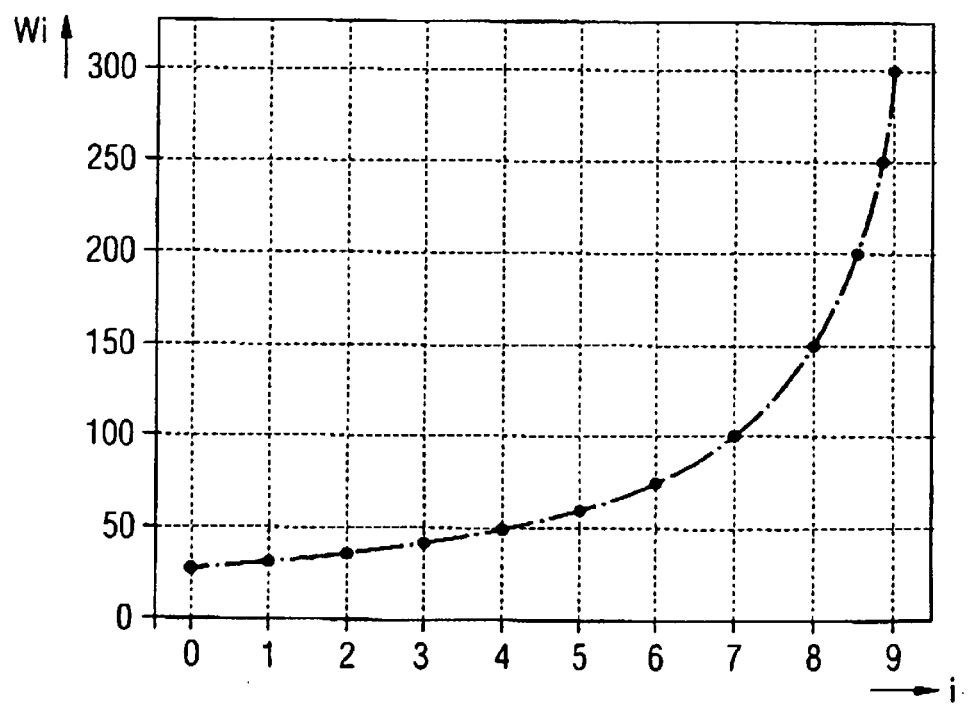
FIG. 6 is a graph showing resulting gate widths for the driver stages of the driver device according to FIG. 1 for setting a linear scaling of the edge rise time curve and/or fall time curve as a function of the index of the respectively active driver stage.

FIG. 6 is a diagram representing the relation between the gate width wi of each driver stage Di and the index of the driver stages for the case where only one single driver stage is active, while all others are switched out. According to formula F1, the gate width of each driver stage Di increases exponentially as the index rises. This is likewise indicated in the equivalent circuit diagram of FIG. 4 by an increase of the gate widths W1 to WN.

This way, it is possible to bring about a linear relation between the respectively active driver stage Di and the edge rise time and/or fall time that sets in for the respective output signal. The variation of the rise time and/or fall time between the different driver stages is then substantially constant. This makes possible control operations with which a desired driver power can be set easily and reliably.

What is claimed is:

1. A scalable driver device, comprising:

a common terminal contact providing a common output signal;

a plurality of driver stages having outputs connected to said common terminal contact for generating the common output signal, said driver stages having drive parameters dimensioned one of individually and in groups such that a difference of at least one of edge rise times and fall times of the common output signal from one of said driver stages being an active driver stage to a next one of said driver stages to be activated being substantially equal to a difference of at least one of the edge rise times and the fall times of the common output signal from said next one of said driver stages activated to a further next one of said driver stages to be activated; and at least one control unit connected to said driver stages for activating and deactivating said driver stages one of individually and in groups.

2. The driver device according to claim 1, wherein each of said driver stages is a single driver.

3. The driver device according to claim 1, wherein a respective driver stage is formed by a sum of individual ones of said driver stages that have already been activated.

4. The driver device according to claim 1, wherein each of said driver stages has at least one transistor with a gate width that is adjustable, and said gate widths are the drive parameters.

5. The driver device according to claim 4, wherein said gate width is dimensioned according to:

$$wi = 1 \Big/ \Big(\frac{1}{w0} - C \cdot i\Big), \text{ with}$$

$$C = \Big(\frac{1}{w0} - \frac{1}{wN}\Big) \Big/ N.$$

whereby wi references said gate width of said at least one transistor of a respective one of said driver stages; w0 is said gate width of a driver stage of said plurality of driver stages having a longest edge rise time and/or fall time; wN is said gate width of a driver stage of said plurality of driver stages having a shortest edge rise time and/or fall time; and N is an index of a last driver stage of said plurality of driver stages.

6. The driver device according to claim 4, wherein said gate width of each of said driver stages is dimensioned according to:

$$wi^* = wi - \sum_{j=0}^{i-1} w*j, i = 1, \ldots, N$$
$$= wi - w(i-1)$$

where w(i−1) is an effective overall gate width of a group of said driver stages that have already been activated as a group.

7. The driver device according to claim 1, wherein said driver stages are dimensioned with respect to at least one of said drive parameters such that the edge rise time and/or fall time of the common output signal varies by approximately a same amount from one driver stage to a next driver stager given successive activation.

8. A scalable driver device, comprising:
   a common terminal contact providing a common output signal;
   a plurality of driver stages having outputs connected to said common terminal contact for generating the common output signal, said driver stages having drive parameters dimensioned one of individually and in groups such that a difference of at least one of edge rise times and fall times of the common output signal form one of said driver stages being an active driver stage to a next one of said driver stages to be activated being substantially equal to a difference of at least one of the edge times and the fall times of the common output signal from said next one of said driver stages activated to a further next one of said driver stages to be activated;
   at least one control unit connected to said driver stages for activating and deactivating said driver stages one of individually and in groups; and
   a thermometer code counter for actuating said driver stages, said thermometer code counter being coupled to said control unit.

9. The scalable driver device, comprising:
   a common terminal contact providing a common output signal;
   a plurality of driver stages having outputs connected to said common terminal contact for generating the common output signal, said driver stages having drive parameters dimensioned one of individually and in groups such that a difference of a least one of edge rise times and fall times of the common output signal from one of said driver stages being an active driver stage to a next one of said driver stages to be activated being substantially equal to a difference of at least one of the edge rise times and the fall times of the common output signal form said next one of said driver stages activated to a further next one of said driver stages to be activated;
   at least one control unit connected to said driver stages for activating and deactivating said driver stages one of individually and in groups; and
   a thermometer code counter for actuating said driver stages, said thermometer code counter being integrated in said control unit.

10. An integrated circuit, comprising:
    a scalable driver device, containing:
       a common terminal contact providing a common output signal;
       a plurality of driver stages having outputs connected to said common terminal contact for generating the common output signal, said driver stages having drive parameters dimensioned one of individually and in groups such that a difference of at least one of edge rise times and fall times of the common output signal from one of said driver stages being an activated driver stage to a next one of said driver stages to be activated being substantially equal to a difference of the edge rise times and the fall times of the common output signal from said next one of said driver stages activated to a further next one of said driver stages to be activated; and
       at least one control unit connected to said driver stages for activating and deactivating said driver stages one of individually and in groups.

\* \* \* \* \*